United States Patent
Radwan et al.

(10) Patent No.: US 8,492,279 B2
(45) Date of Patent: Jul. 23, 2013

(54) METHOD OF CONTROLLING CRITICAL DIMENSIONS OF VIAS IN A METALLIZATION SYSTEM OF A SEMICONDUCTOR DEVICE DURING SILICON-ARC ETCH

(75) Inventors: Mohammed Radwan, Dresden (DE); Johann Steinmetz, Koenigsbrunn (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 241 days.

(21) Appl. No.: 13/164,899

(22) Filed: Jun. 21, 2011

(65) Prior Publication Data
US 2012/0028472 A1    Feb. 2, 2012

(30) Foreign Application Priority Data
Jul. 30, 2010  (DE) .................. 10 2010 038 740

(51) Int. Cl.
*H01L 21/311* (2006.01)
*H01L 21/302* (2006.01)
*H01L 21/00* (2006.01)

(52) U.S. Cl.
USPC .................. 438/700; 438/734; 438/5

(58) Field of Classification Search
None
See application file for complete search history.

(56) References Cited

U.S. PATENT DOCUMENTS

| | | | |
|---|---|---|---|
| 2007/0178699 A1* | 8/2007 | Schaller et al. | 438/689 |
| 2008/0137078 A1* | 6/2008 | Lally et al. | 356/237.2 |
| 2009/0087992 A1 | 4/2009 | Srivastava et al. | |
| 2009/0191711 A1* | 7/2009 | Rui et al. | 438/695 |
| 2012/0028376 A1* | 2/2012 | Radwan et al. | 438/5 |
| 2012/0244710 A1* | 9/2012 | Chumakov et al. | 438/701 |

OTHER PUBLICATIONS

Translation of Official Communication from German Patent Application No. 10 2010 038 740.1 dated Mar. 25, 2011.

* cited by examiner

*Primary Examiner* — Scott B Geyer
(74) *Attorney, Agent, or Firm* — Williams, Morgan & Amerson, P.C.

(57) ABSTRACT

When forming via openings in sophisticated semiconductor devices, a silicon-containing anti-reflective coating (ARC) layer may be efficiently used for adjusting the critical dimension of the via openings by using a two-step etch process in which, in at least one of the process steps, the flow rate of a reactive gas component may be controlled to increase or reduce the resulting width of an opening in the silicon ARC layer. In this manner, the spread of critical dimensions of vias around the target value may be significantly reduced while also reducing any maintenance and rework efforts.

20 Claims, 5 Drawing Sheets

METHOD OF CONTROLLING CRITICAL DIMENSIONS OF VIAS IN A METALLIZATION SYSTEM OF A SEMICONDUCTOR DEVICE DURING SILICON-ARC ETCH

BACKGROUND OF THE INVENTION

1. Field of the Invention

Generally, the present disclosure relates to microstructures, such as advanced integrated circuits, and, more particularly, to conductive structures, such as copper-based metallization layers, comprising metal lines and vias.

2. Description of the Related Art

In the fabrication of modern microstructures, such as integrated circuits, there is a continuous drive to steadily reduce the feature sizes of microstructure elements, thereby enhancing the functionality of these structures. For instance, in modern integrated circuits, minimum feature sizes, such as the channel length of field effect transistors, have reached the deep sub-micron range, thereby increasing performance of these circuits in terms of speed and/or power consumption and/or diversity of functions. As the size of individual circuit elements is reduced with every new circuit generation, thereby improving, for example, the switching speed of the transistor elements, the available floor space for interconnect lines electrically connecting the individual circuit elements is also decreased. Consequently, the dimensions of these interconnect lines are also reduced to compensate for a reduced amount of available floor space and for an increased number of circuit elements provided per unit die area, as typically the number of interconnections required increases more rapidly than the number of circuit elements. Thus, usually, a plurality of stacked "wiring" layers, also referred to as metallization layers, is provided, wherein individual metal lines of one metallization layer are connected to individual metal lines of an overlying or underlying metallization layer by so-called vias. Despite the provision of a plurality of metallization layers, reduced dimensions of the interconnect lines are necessary to comply with the enormous complexity of, for instance, modern CPUs, memory chips, ASICs (application specific ICs) and the like.

Advanced integrated circuits, including transistor elements having a critical dimension of 0.05 µm and even less, may, therefore, typically be operated at significantly increased current densities of up to several kA per cm$^2$ in the individual interconnect structures, despite the provision of a relatively large number of metallization layers, owing to the significant number of circuit elements per unit area. Consequently, well-established materials, such as aluminum, are being replaced by copper and copper alloys, i.e., materials with significantly lower electrical resistivity and improved resistance to electromigration, even at considerably higher current densities, compared to aluminum. The introduction of copper into the fabrication of microstructures and integrated circuits comes along with a plurality of severe problems residing in copper's characteristic to readily diffuse in silicon dioxide and a plurality of low-k dielectric materials, which are typically used in combination with copper in order to reduce the parasitic capacitance within complex metallization layers.

Another characteristic of copper significantly distinguishing it from aluminum is the fact that copper may not be readily deposited in larger amounts by chemical and physical vapor deposition techniques and it does not form volatile etch byproducts when exposed to currently established etch processes, thereby requiring a process strategy that is commonly referred to as the damascene or inlaid technique. In the damascene process, first a dielectric layer is formed which is then patterned to include trenches and/or vias which are subsequently filled with copper, wherein, prior to filling in the copper, a conductive barrier layer is formed on sidewalls of the trenches and vias. The deposition of the bulk copper material into the trenches and vias is usually accomplished by wet chemical deposition processes, such as electroplating and electroless plating, thereby requiring the reliable filling of vias with an aspect ratio of 5 and more with a diameter of 0.3 µm or even less, in combination with trenches having a width ranging from 0.1 µm to several µm. Electrochemical deposition processes for copper are well established in the field of electronic circuit board fabrication. However, for the dimensions of the metal regions in semiconductor devices, the void-free filling of high aspect ratio vias is an extremely complex and challenging task, wherein the characteristics of the finally obtained copper-based interconnect structure significantly depend on process parameters, materials and geometry of the structure of interest. Since the basic geometry of interconnect structures is substantially determined by the design requirements and may, therefore, not be significantly altered for a given microstructure, it is of great importance to estimate and control the impact of materials, such as conductive and non-conductive barrier layers, of the copper microstructure and their mutual interaction on the characteristics of the interconnect structure so as to insure both high yield and the required product reliability.

In addition, to achieve high production yield and superior reliability of the metallization system, it is also important to accomplish these goals on the basis of a high overall throughput of the manufacturing process under consideration. For instance, the so-called dual damascene process is frequently used, in which a via opening and a corresponding trench are filled in a common deposition sequence, thereby providing superior process efficiency.

In the damascene technique or inlaid technique, typically, the patterning of the via openings and the trenches may require sophisticated lithography techniques since the shrinkage of critical dimensions in the device layer, i.e., for transistors and other semiconductor circuit elements, may also require a corresponding adaptation of the critical dimensions of the vias and metal lines to be formed in the metallization system. In some well-established process techniques, a patterning regime may be used, which may commonly be referred to as "via first-trench last" approach, in which at least a portion of a via opening may be formed first on the basis of a specific etch mask and thereafter a corresponding trench mask may be provided in order to form a corresponding trench in the upper portion of the dielectric material, wherein, depending on the overall process strategy, during the trench etch process, the remaining portion of the via opening may also be completed, while, in other cases, the via opening may be provided such that it extends down to a bottom etch stop layer, which may then be opened after completing the trench etch process.

Consequently, a complex patterning regime including at least two critical lithography steps has to be used in order to provide appropriate etch masks for the via openings and the trenches. With shrinking critical dimensions of the circuit elements and thus also of the metal features to be provided in the metallization system of complex semiconductor devices, a precise definition of the lateral size of the trenches and via openings may become increasingly difficult since, for instance, the thickness of sophisticated resist materials has to be adapted to the sophisticated lithography conditions, which may typically restrict the effective etch resistivity of sophisticated resist materials. That is, significant progress has been made in optical lithography techniques, for instance by increasing numerical aperture and reducing the exposure wavelengths, for instance to approximately 193 nm in presently sophisticated lithography techniques, thereby also, however, reducing the depth of focus during the critical lithography processes. As a consequence of these developments, the characteristics of the resist materials also have to be adapted, thereby requiring a significant reduction of the usable layer thickness so that the resist material may not allow directly patterning any underlying low-k dielectric materials due to the reduced selectivity between the resist material and the dielectric material to be etched. Consequently, typical complex material systems, including hard mask materials and the like, have to be provided, in combination with superior process control regimes, in order to form critical features in the metallization system of the semiconductor device in accordance with the design requirements.

With reference to FIGS. 1a-1f, a typical configuration and manufacturing strategy for forming critical metallization layers of sophisticated semiconductor devices will now be described in more detail.

FIG. 1a schematically illustrates a cross-sectional view of a semiconductor device 100 in an advanced manufacturing stage. As illustrated, the device 100 comprises a substrate 101 and a semiconductor layer 102, such as a silicon layer, in and above which a plurality of circuit elements 103, such as transistors, resistors, capacitors and the like, are provided. The circuit elements 103 typically comprise any components, such as gate electrode structures and the like, which may be formed on the basis of critical dimensions of 50 nm and less. For example, presently, complex semiconductor devices are under development in which a gate length of less than 30 nm is to be implemented when complex field effect transistors are considered. The circuit elements 103 are typically embedded in a dielectric material 111 of a contact level 110, wherein the dielectric material 111 may represent any appropriate material system, for instance based on silicon nitride, silicon dioxide and the like. A plurality of contact elements 112 provide electrical connection of the circuit elements 103 with a metallization system 120 of the device 100. In the manufacturing stage shown, metallization layers 130, 140 of the metallization system 120 are provided, wherein, as previously discussed, corresponding metal features may have to be adapted in size and packing density to the architecture and configuration of the circuit elements 103. For example, the metallization layer 130 may comprise any appropriate dielectric material 131, such as a low-k dielectric material and the like, in which are formed metal lines 132, which may appropriately connect to the contact elements 112. Thus, in densely packed device areas, the contact elements 112 and the metal lines 132 may have lateral dimensions, i.e., at least in the horizontal direction of FIG. 1a, that are comparable in magnitude to the critical lateral dimensions of the circuit elements 103. Similarly, metal lines 142L and vias 142V of the metallization layer 140 are embedded in a dielectric material 141, such as a low-k dielectric material, an ultra low-k (ULK) material and the like, and may appropriately connect to the metal lines 132.

In this respect, a low-k dielectric material is to be considered as a dielectric material having a dielectric constant of 3.0 or less, while typically a ULK material may be understood herein as a dielectric material having a dielectric constant of 2.7 and less. Furthermore, typically, an appropriate etch stop material 143, which may also act as a confinement or cap layer for the metal material in various metal features, may be provided in order to appropriately control the complex patterning process for forming at least the vias 142V in the metallization layer 140. The etch stop layer 143 may be provided in the form of a silicon material including nitrogen, carbon, oxygen and the like in order to provide superior etch stop capabilities, while not unduly increasing the overall permittivity of the metallization system 120. For example, a plurality of material compositions, also referred to as BLOK (bottom low-k) materials, have been developed with a dielectric constant of 4.0 and less, which may exhibit high etch resistivity with respect to any plasma assisted etch recipes used for patterning low-k dielectric materials, while also providing high copper diffusion blocking effects in order to suppress copper migration into sensitive device areas.

The semiconductor device 100 as illustrated in FIG. 1a may be formed on the basis of the following process strategies. The circuit elements 103 are typically formed by using sophisticated lithography techniques, deposition processes, implantation and etch techniques, wherein, however, many of the associated lithography and etch processes may be performed on the basis of a reduced layer thickness compared to the metallization system 120 and also on the basis of a superior device topography, thereby obtaining the desired critical dimensions, frequently without applying sophisticated hard mask and other sacrificial material systems. After completing the circuit elements 103, the contact level 110 may be formed by depositing the dielectric material or material system 111 and patterning the same in order to form openings, which may be subsequently filled with an appropriate conductive material, any excess portions thereof may be removed by chemical mechanical polishing (CMP) and the like, thereby providing the electrically insulated contact elements 112. The process of patterning the contact level 110, however, may contribute to a pronounced surface topography, thereby increasingly contributing to very sophisticated process conditions during the subsequent processing of the device 100. Thereafter, the metallization layer 130 may be formed by depositing the dielectric material 131 and patterning the same in order to fill in an appropriate conductive material, such as copper in combination with any appropriate barrier materials. After the removal of any excess material, the etch stop layer 143 may be deposited, followed by the dielectric material 141, which may also be patterned by sophisticated lithography techniques using any appropriate process strategy, such as a via-first approach and the like, wherein at least two critical lithography steps may have to be performed in order to define the lateral size and position of the vias 142V and of the metal lines 142ll. Typically, any such critical lithography processes and the subsequent patterning process for transferring the openings of the resist material finally into the underlying dielectric material may be performed on the basis of well-established control regimes, such as advanced process control regimes (APC), which are designed such that, based on a moderate amount of measurement data, a control of the process sequence may be achieved, in which the process result, i.e., the critical dimensions of the feature sizes under consideration, may be centered around the target value.

FIG. 1b schematically illustrates a corresponding process control regime for a process flow for forming the metal lines 142L and vias 142V (FIG. 1a). To this end, a manufacturing environment 150 may comprise a plurality of manufacturing and metrology tools in which a resist material may be patterned on the basis of photolithography and wherein finally trenches and via openings may be provided in a low-k dielectric material on the basis of any process strategies. For example, as shown, a first process module 151 may represent a portion of the manufacturing environment 150 in which a plurality of lithography tools and related process tools may be provided in order to form appropriate resist material layers on any substrates, such as the substrate 101. To this end, the module 151 may comprise spin-on process tools for forming one or more resist layers, pre-exposure bake tools, post-exposure bake tools, develop stations and the like. Moreover, the module 151 may comprise one or more lithography tools which may expose the resist material on the basis of respective lithography masks in order to transfer the mask pattern into the resist material. Moreover, a metrology module 152 may be provided, which may include any optical inspection techniques for determining the critical dimensions of the resist features after being processed in the lithography module 151. Hence, the metrology module 152 may provide respective measurement data from selected ones of the substrates 101 processed by the module 151 and may provide the measurement data to a control unit 155, which may, based on the desired CD target value, select an appropriate target value for one process parameter, which may sensitively influence the process result of the process module 151. For example, the control unit 155 may provide a target value for an exposure dose that is to be applied upon processing the substrate 101, wherein the unit 155 may determine the target value of the exposure dose such that, based on the measurement data obtained from the module 152, any substrates 101 to be processed in the module 151 are expected to substantially comply with the CD target value. To this end, the control unit 155 may have implemented therein any predictive model of, for instance, the exposure process in the module 151, which may correlate the measurement data from the module 152 with the desired CD target value. Moreover, the environment 150 may comprise a rework module 153, which may receive any substrates 101A which may not be within a valid range of the critical dimensions and which are thus expected to be outside of the specifications after finally transferring the critical dimensions of the resist layers into any lower-lying material in an etch module 156.

It should be appreciated that the lithography module 151 has a somewhat unique position in the whole manufacturing sequence for forming complex microstructure devices since the resist material may be efficiently removed without significantly affecting any underlying material layers, such as dielectric materials and the like, then by enabling a further application of resist material in order to reprocess the corresponding substrates in the lithography module 151. To this end, however, a plurality of additional process steps, such as cleaning processes and the like, may be required in the rework module 153, which may thus contribute to the overall production costs. Similarly, the processing of the substrates 101 in the lithography module 151 may represent one of the most cost-intensive process modules, so that undue increase of the number of substrates to be reworked may significantly affect overall throughput of the manufacturing environment 150.

FIG. 1c schematically illustrates a further portion of the manufacturing environment 150 in which a further metrology module 157 may be provided downstream of the etch module 156 in order to provide measurement data of the finally implemented critical dimensions, i.e., of any via openings and trenches formed in the low-k dielectric material of the metallization system of the substrate 101. It should be appreciated that the possibility of reworking any substrates after having been processed in the module 156 are very limited, since typically the removal of any invalidly patterned low-k dielectric materials may be difficult to achieve without significantly affecting any further device areas, such as lower-lying metallization layers and the like. The measurement data obtained from the module 157 may be supplied to a further control unit 158, which may provide appropriate target values for one or more etch steps for at least the etch step for patterning the low-k dielectric material under consideration. The control unit 158 may thus mainly strive to provide an etch result that is strongly correlated to the critical dimension obtained from a substrate after the lithography module 151, which may be forwarded to the etch module 156 if complying with the predefined valid range of critical dimensions determined by the metrology module 152 (FIG. 1b).

As a consequence, appropriate control regimes may be applied, for instance by using statistical process control techniques and the like, in combination with APC strategies in order to provide the final openings in the low-k dielectric material with actual lateral dimensions that may be distributed around the target values, wherein the spread of the distribution may indicate the quality of the overall process flow and thus also of the control mechanisms. It should be appreciated that a significant spread of the lateral dimensions of the corresponding openings may grossly affect the electrical performance of the resulting metallization system since, for instance, line resistance, parasitic capacitance and the like may be strongly correlated with the lateral dimensions of the resulting metal features.

FIG. 1d schematically illustrates a cross-sectional view of the semiconductor device 100 according to a process strategy in which via openings may be formed in the metallization layer 140 according to sophisticated lithography techniques. As illustrated, a hard mask material 104, such as a silicon dioxide material, may be provided on the low-k dielectric material 141, followed by an optical planarization material 105, which may typically be provided in the form of an organic material. Furthermore, a silicon-containing anti-reflective coating (ARC) layer 106 is formed on the planarization layer 105, followed by a resist mask 107, which may comprise a latent image in the form of exposed regions 107A, which may thus basically define the lateral size and position of via openings to be formed in the low-k dielectric material 141. As previously discussed, sophisticated lithography processes may require specifically adapted resist materials, which may no longer be applicable with a moderately large layer thickness, which, however, would be desirable in view of planarizing the overall surface topography of the device 100 prior to performing a critical lithography process and which would also be desirable in view of a high etch resistivity to pattern any underlying material layers. Moreover, in critical lithography processes, in particular using short wavelengths, such as 193 nm and less, superior ARC capabilities may be required wherein, for instance, a moderately high absorption is typically necessary in order to reduce the back reflection approximately one percent and less. Providing an ARC material on the basis of an organic material, which may be preferable in view of providing this material on the basis of spin-on techniques, however, may result in a low etch selectivity with respect to the resist material 107 so that frequently an additional ARC material may be used, such as the layer 106 comprising silicon as an inorganic component, thereby significantly increasing the etch resistivity with respect to a plurality of etch chemistries that are typically used for performing a patterning process based on a resist material. Consequently, on the basis of the exposed resist mask 107, i.e., after development of the resist material 107, the silicon-containing ARC layer 106 may be patterned and thereafter the underlying materials, i.e., the material 105 and finally the hard mask 104, may be patterned in order to transfer the mask openings 107A into the hard mask material 104.

As discussed above, prior to actually patterning the hard mask 104, the actual lateral dimensions of the openings 107A may be determined, for instance, in the metrology module 152 of FIG. 1b, in order to provide the desired measurement data for controlling the lithography process, as discussed above, and to determine whether or not the mask openings 107A have lateral dimensions within the predefined valid range. If dimensions of the mask openings 107A are not within the valid range, the device 100 may be subjected to a rework process which, however, may require the removal of the layers 105, 106 and 107, thereby resulting in a moderately complex rework process sequence.

FIG. 1e schematically illustrates the semiconductor device 100 in a corresponding manufacturing stage in which the mask openings 107A of the resist material 107 are transferred into the silicon-containing ARC layer, as indicated by 106A, which may thus have substantially the same lateral size as the openings 107A. During the corresponding etch process, which may be performed on the basis of a fluorine-based etch chemistry, a more or less pronounced amount of the resist layer 107 may be consumed, however, nevertheless enabling a reliable transfer of the pattern of the layer 107 into the ARC layer 106. Thereafter, the openings 106A may be transferred into the planarization material 105, for instance using an oxygen-based plasma ambient, wherein the resist material 107 may be consumed while, however, the silicon-containing ARC material 106 may provide efficient etch resistivity in order to etch through the material 105 and finally into the hard mask material 104.

FIG. 1f schematically illustrates the semiconductor device 100 during an etch process 108 that is configured to etch through low-k dielectric material 141 on the basis of the hard mask 104, which may comprise corresponding mask openings 104A that have been obtained on the basis of the openings 106A (FIG. 1e), as discussed above. During the etch process 108, process parameters, such as pressure, plasma power, temperature, and in particular the flow rates of any gas components, may be controlled so as to obtain a via opening 141V that substantially corresponds to the opening 104A of the hard mask 104. For example, low-k dielectric materials may be etched on the basis of $C_4F_8$ as a reactive gas component, possibly in combination with argon, nitrogen and the like, wherein the etch process 108 may be reliably stopped in and on the etch stop layer 143, which may then be opened by an additional etch step, for instance based on a reactive gas component comprising $SF_6$ and oxygen and the like.

Consequently, a plurality of complex processes are typically associated with providing the via opening 141V, which may result in a significant spread of the resulting final critical dimensions of the via opening 141V with respect to a desired target value, since, for instance, independent control mechanisms may be implemented in the lithography process for forming the resist layer 107 (FIG. 1e) and in the etch process 108, as previously discussed with reference to FIGS. 1b and 1c, so that a plurality of process variabilities may not be appropriately taken account of in the control mechanism. Consequently, significant maintenance effort may have to be made, for instance in appropriately preparing the hardware resources, such as etch tools, lithography tools and the like, in order to avoid even subtle process fluctuations that may be caused by any variations of complex hardware tools. Furthermore, additional cleaning processes may be implemented in order to reduce overall process variations during the complex patterning process in order to avoid undue variation of the critical dimensions.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques in which low-k dielectric materials of metallization systems may be patterned so as to receive a via opening on the basis of complex sacrificial materials, such as a silicon-containing ARC layer, while additionally providing an additional "intermediate" control mechanism, thereby enabling superior control of the final critical dimensions of the via openings. To this end, the patterning process for transferring a resist pattern into the silicon-containing ARC layer may be used to control the critical dimension of the via opening. In this manner, an additional point in the overall process flow may be implemented in which an efficient adaptation of the lateral size of the via openings may be accomplished. In this manner, a spread in critical dimensions of the resist pattern may be reduced, thereby also enabling a selection of a wider range of valid critical dimensions after lithography, which in turn may result in a reduced degree of reworking after the lithography process. According to some illustrative aspects disclosed herein, the silicon-containing ARC layer may be patterned on the basis of a two-step etch process, wherein, in any of the process steps, an efficient re-adjustment of the mask openings of the resist material may be achieved, for instance by controlling the flow rate of at least one precursor gas in a corresponding process step.

One illustrative method disclosed herein comprises forming a resist mask above a silicon-containing ARC layer that is formed above a metallization layer of a semiconductor device, wherein the resist mask comprises a first mask opening having a first lateral size. The method further comprises performing a first etch process using a first reactive process ambient so as to etch a first portion of the silicon-containing ARC layer through the first mask opening. Moreover, the method comprises performing a second etch process using a second process ambient so as to etch through the silicon-containing ARC layer through the first mask opening and so as to form a second mask opening in the silicon-containing ARC layer, wherein the second mask opening has a second lateral size. The method additionally comprises controlling at least one of the first and second etch processes so as to adjust the second lateral size. Moreover, the method comprises forming a via opening in a dielectric material of the metallization layer by using the second mask opening.

A further illustrative method disclosed herein relates to forming a via opening in a low-k dielectric material of a metallization layer of a semiconductor device. The method comprises receiving measurement data indicating a lateral size of a mask opening that is formed in a resist layer. Additionally, the method comprises determining a flow rate of a first gas component for a first etch process by using the measurement data and a target value of the via opening, wherein the first etch process is configured to etch a first portion of an opening into an ARC layer that is formed below the resist layer. The method further comprises determining a flow rate of a second gas component for a second etch process by using the measurement data and a target value of the via opening, wherein the second etch process is configured to etch the opening through the ARC layer through the first portion of the opening. The method further comprises performing the first and second etch processes by using the flow rate of the first and second gas components so as to form the opening in the ARC layer. Moreover, the method comprises forming the via opening in the low-k dielectric material by using the opening.

A still further illustrative method disclosed herein comprises performing a first etch process by using an oxygen-containing precursor gas and a carbon and fluorine-containing precursor gas so as to form a first portion of an opening in a silicon-containing ARC layer that is formed above a dielectric material of a semiconductor device. The method further comprises performing a second etch process by using a polymerizing precursor gas so as to form the opening in the silicon-containing ARC layer through the first portion. Furthermore, the method comprises controlling a flow rate of the oxygen-containing precursor gas of the first etch process and/or of the polymerizing gas of the second etch process in order to adjust a lateral dimension of the opening. Furthermore, the method comprises forming a mask opening in a hard mask layer on the basis of the opening and etching the dielectric material by using the hard mask layer so as to form a contact opening in the dielectric material.

BRIEF DESCRIPTION OF THE DRAWINGS

The disclosure may be understood by reference to the following description taken in conjunction with the accompanying drawings, in which like reference numerals identify like elements, and in which.

Figure 1A:
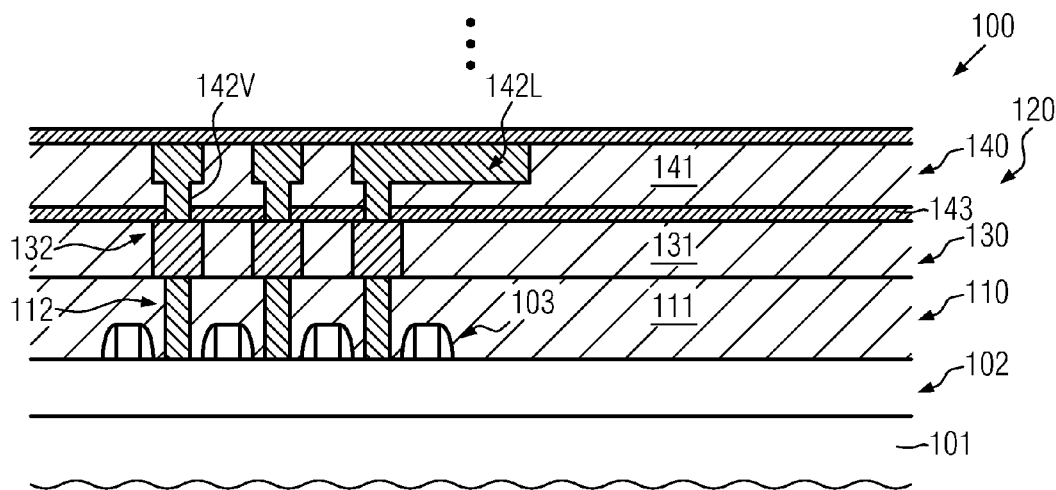
FIG. 1a schematically illustrates a cross-sectional view of a semiconductor device comprising a complex metallization system.
Figure 1B:
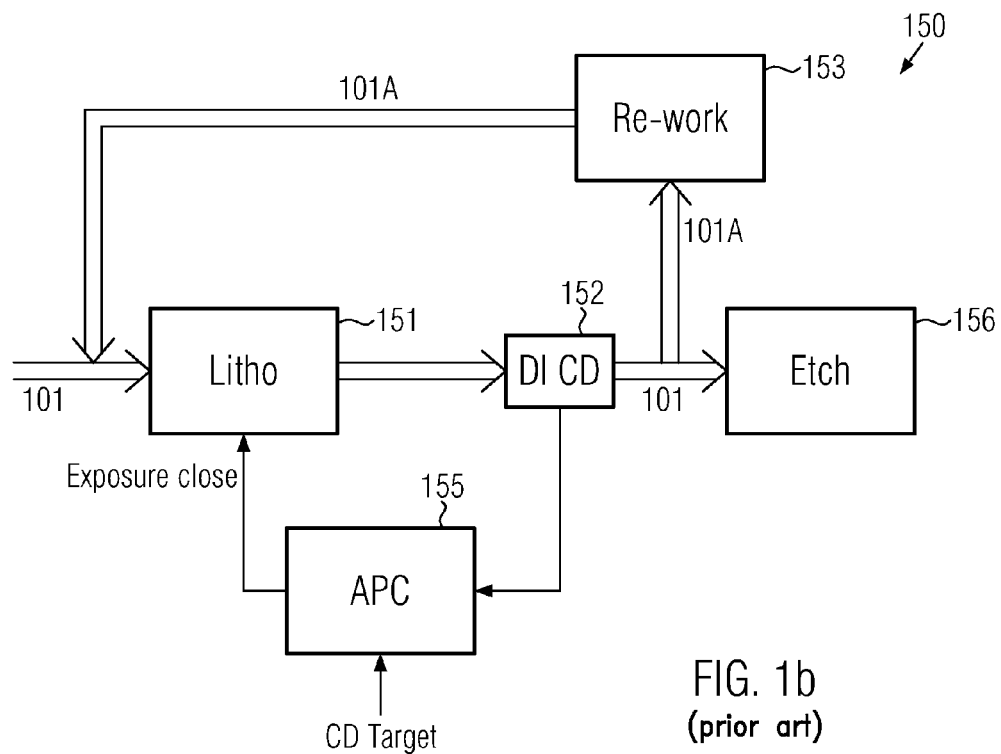
FIGS. 1b and 1c schematically illustrate a manufacturing environment including process tools for patterning a low-k dielectric material of a metallization system on the basis of advanced process control strategies, according to conventional techniques.
Figure 1C:
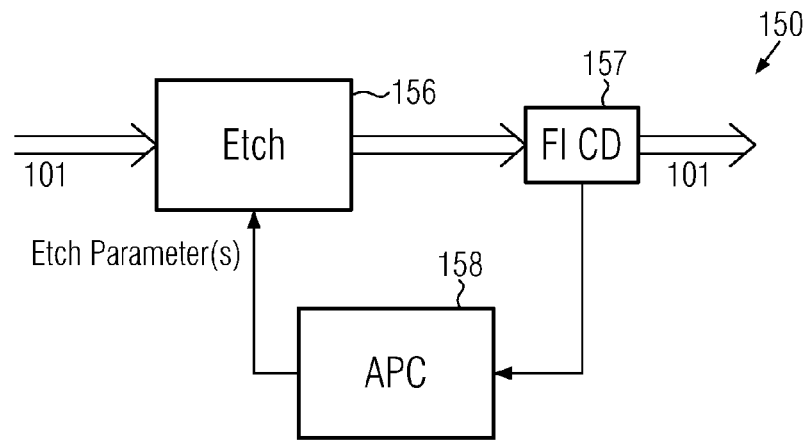
Figure 1D:
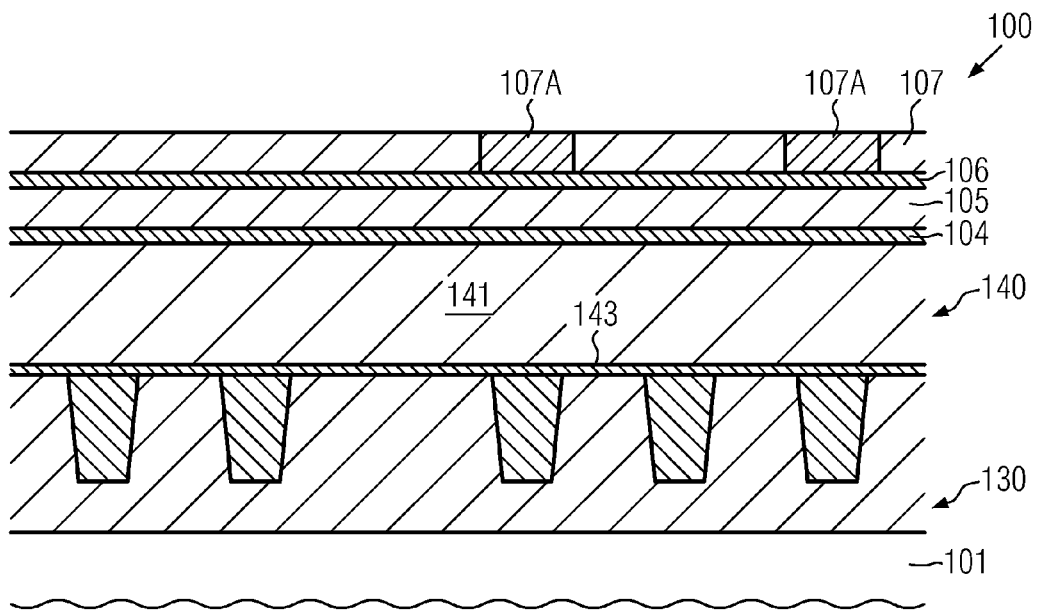
FIGS. 1d-1f schematically illustrate cross-sectional views of the semiconductor device when forming a via opening on the basis of a complex sacrificial material system, according to conventional process strategies.
Figure 1E:
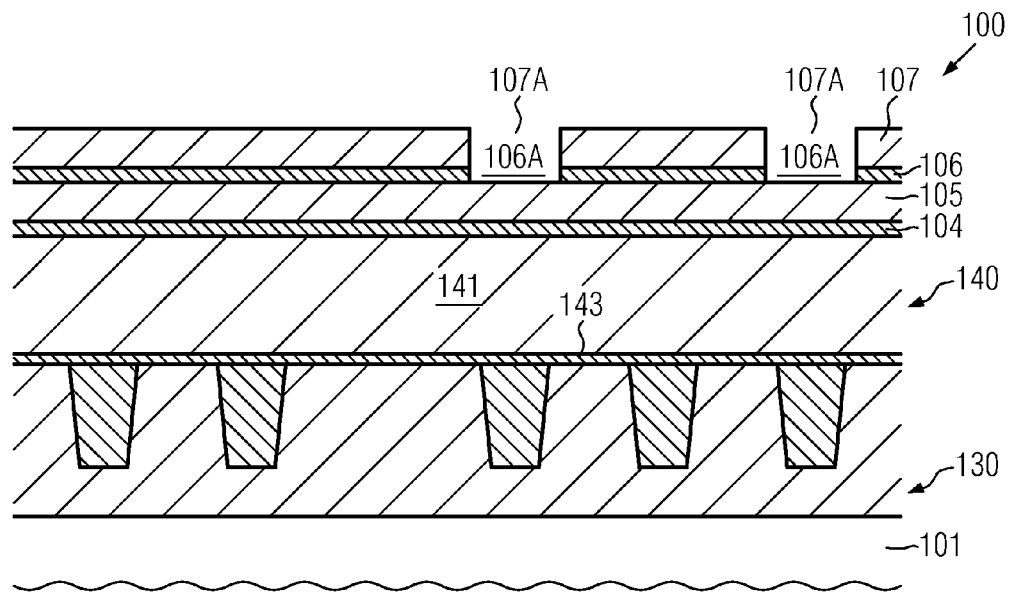
Figure 1F:
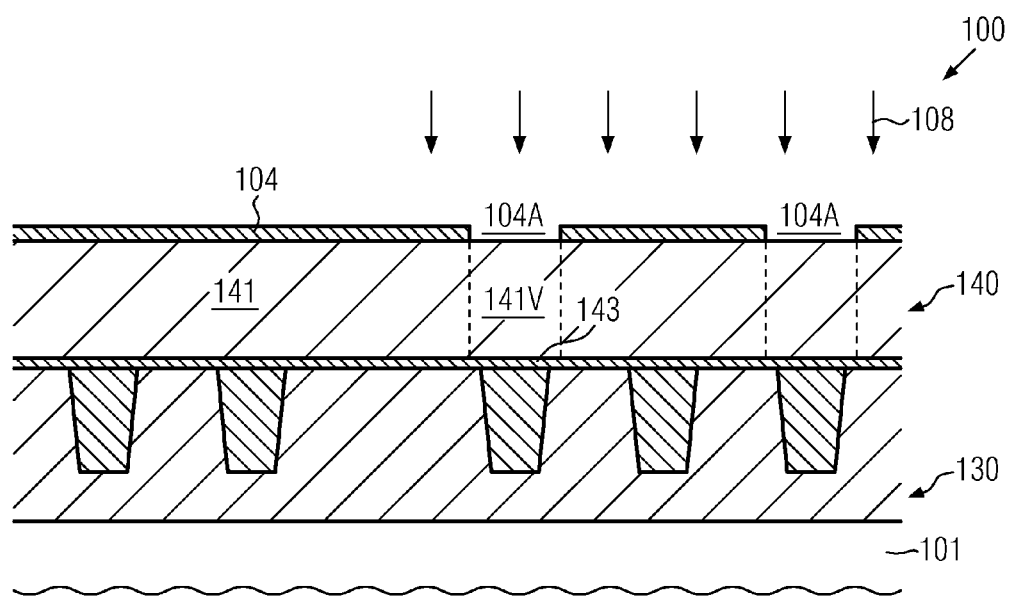

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides manufacturing techniques in which superior process control may be accomplished when forming sophisticated via openings in a low-k dielectric material of a metallization system by controlling an etch process for patterning a silicon-containing ARC layer so as to adjust the critical dimension of the via opening. To this end, the etch processes may be established on the basis of different reactive process atmospheres, wherein, in at least one of the process steps, the flow rate of one gas component may be controlled such that a desired critical dimension may be obtained in the ARC layer. In some illustrative embodiments, the control strategy may be based on at least the measurement data obtained from the previously performed lithography process in order to determine an appropriate target value for the one or more flow rates for the two-step etch process for patterning the silicon-containing ARC layer. That is, depending on the critical dimensions obtained after the lithography process, an increase or decrease of the critical dimension may be effected by appropriately selecting flow rates of one or both of the etch processes for patterning the silicon-containing ARC layer. Since this layer may be used as an efficient mask for the patterning of the lower-lying hard mask material, a very efficient control mechanism may be implemented in addition to conventional strategies, thereby significantly reducing the spread of the final critical dimensions of the via openings and also allowing a greater degree of variability of the critical dimensions of the resist masks, thereby significantly reducing the degree of reworking. Due to the additional control mechanism for adjusting the critical dimensions of the via openings, superior process robustness may be accomplished, thereby providing the possibility of reducing any maintenance work, such as replacement of hardware components, of critical process tools and the like.

With reference to FIGS. 2a-2d, further illustrative embodiments will now be described in more detail, wherein reference may also be made to FIGS. 1a-1f, if appropriate.

Figure 2A:
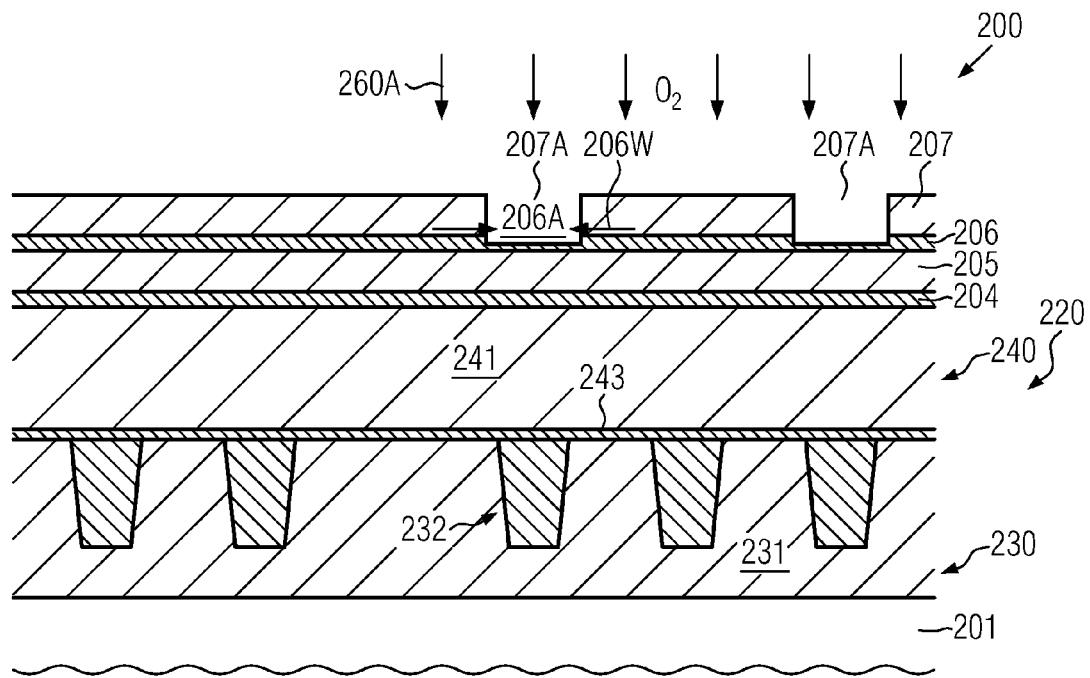
FIG. 2a schematically illustrates a cross-sectional view of a semiconductor device upon patterning a silicon-containing ARC layer in a first etch process based on a resist layer, according to illustrative embodiments.

FIG. 2a schematically illustrates a cross-sectional view of a semiconductor device 200 in a manufacturing stage in which via openings are to be formed in a metallization layer 240 of a metallization system 220 of the device 200. As illustrated, the device 200 may comprise a substrate 201 above which is formed the metallization system 220. It should be appreciated that the device 200 may also comprise semiconductor-based circuit elements and the like, as is also previously discussed with reference to the semiconductor device 100, for instance as shown in FIG. 1a. Consequently, the device 200 may comprise circuit elements, such as field effect transistors, that may be formed on the basis of critical dimensions of 50 nm and significantly less, as is also discussed above. Furthermore, as shown, the metallization system 220 may comprise a metallization layer 230 comprising any appropriate dielectric material 231 and metal regions 232, at least some of which may have to be contacted by vias to be formed in the metallization layer 240. For example, a similar contact regime may have to be established as is also described above with reference to the semiconductor device 100. Thus, the metallization layer 240 may comprise a low-k dielectric material 241 or a ULK material in combination with one or more material layers, such as an etch stop layer 243. Moreover, a cap layer or hard mask material 204, for instance provided in the form of a silicon dioxide material and the like, may be provided above the low-k dielectric material 241, followed by an optical planarization material 205, such as an organic material and the like. Moreover, a silicon-containing ARC layer 206 may be provided on the planarization layer 205, followed by a resist mask 207.

The semiconductor device 200 comprising the metallization layer 240 may be formed on the basis of process strategies as are also described above with reference to the semiconductor device 100. Similarly, the material system comprising the layers 204, 205, 206 and 207 may be provided in accordance with any well-established process technique. The resist layer 207 may be patterned on the basis of sophisticated lithography techniques, as discussed above, followed by a development procedure in order to form mask openings 207A therein, which may basically define the lateral size and position of via openings still to be formed in the low-k dielectric material 241. Thereafter, the semiconductor device 200 may be exposed to a reactive etch ambient 260A, in which the resist mask 207 may be used as an etch mask for etching into the silicon-containing ARC layer 206, thereby forming a first portion of an opening 206A therein. The reactive process ambient of the process 260A may be established on the basis of precursor gases, such as carbon and fluorine-containing gases, such as $CF_4$, in combination with an oxygen-containing gas, such as $O_2$, possibly in combination with a polymerizing gas, such as $CH_2F_2$ and the like. Typically, these gases may be supplied to any appropriate etch tool in which a plasma-based ambient may be established, wherein appropriate parameters, such as plasma power, bias power, temperature of the substrate, pressure and the like, may be established so as to obtain a desired etch behavior. For example, in typical etch tools for processing 200 diameter substrates or 300 diameter substrates, a process pressure of approximately ten to several hundred mTorr may be established, while a corresponding flow rate of precursor gases may be adjusted to several SCCM (standard cubic centimeter per minute) to a thousand SCCM, while any appropriate temperature, such as approximately 10-100° C., may be selected. It should be appreciated that appropriate parameters may also depend on the configuration of the corresponding etch tools and may thus vary, wherein, however, appropriate parameter settings may be readily determined by performing experiments for a plurality of different parameter values. In some illustrative embodiments, the flow rate of the oxygen-containing precursor gas, such as the oxygen gas, may be controlled such that a desired degree of variation of a lateral dimension 206W of the opening 206A formed in an upper portion of the ARC layer 206 may be achieved. That is, by controlling the oxygen contents in the reactive ambient 260A, the lateral etch rate may also be controlled so that the opening 206A may be formed with a different lateral dimension compared to the mask openings 207A in the resist layer 207, if a corresponding deviation from the lateral size of the openings 207A is expected to result in a critical lateral size of via openings still to be formed in the material 241 with superior matching of the desired critical dimension of the via openings. For example, as previously discussed, typically, a certain predefined range of valid critical dimensions of the resist openings 207A may have to be defined in advance in order to obtain a desired acceptable spread of the resulting critical dimensions of the via openings when patterned into the low-k dielectric material 241. By appropriately adapting the width 206W, the corresponding spread of the critical dimensions of the openings 207A between various substrates may be compensated for so that the further processing may be continued on the basis of a less pronounced spread of critical dimensions, for instance upon patterning the material 241. Upon varying the flow rate of the oxygen-containing precursor gas, in particular, the removal rate for the silicon species in the layer 206 may be influenced, however, without significantly affecting the removal rate for the resist material 207, thereby providing substantially stable conditions for the resist mask 207 while enabling an efficient adjustment of the width 206W.

Figure 2B:
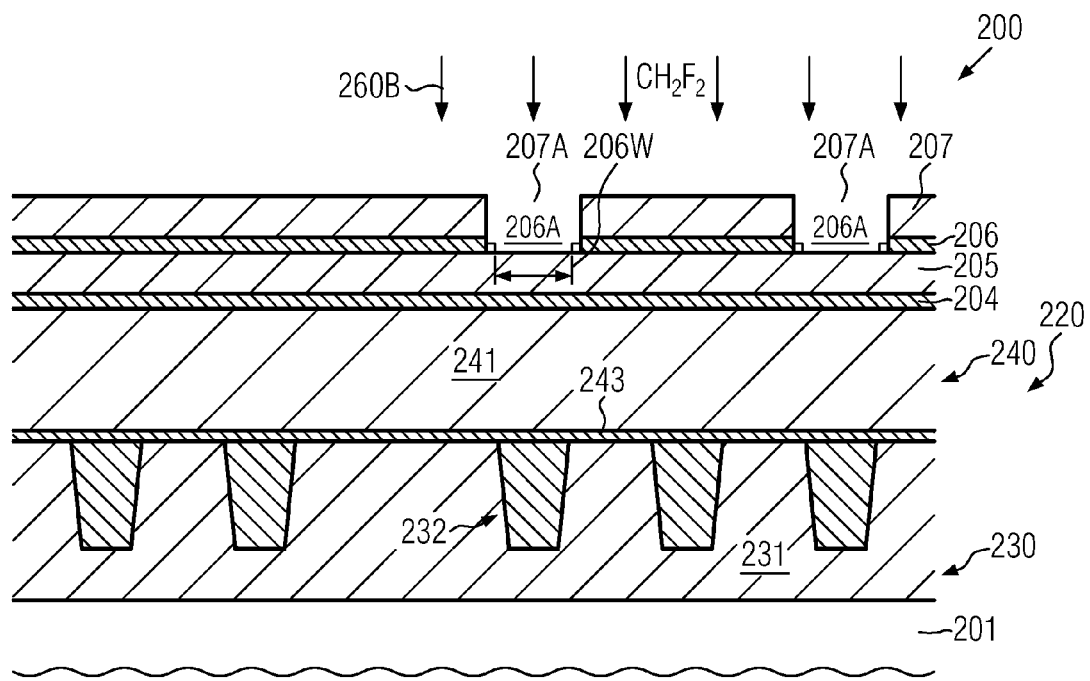
FIG. 2b schematically illustrates a cross-sectional view of the semiconductor device during a second etch process for patterning the silicon-containing ARC layer, while controlling a lateral size of the corresponding mask openings, according to further illustrative embodiments.

FIG. 2b schematically illustrates the semiconductor device 200 when exposed to a further reactive process ambient 260B that is configured so as to further etch the ARC layer 206. Consequently, the opening 206A may be increased in the vertical direction so as to extend to or into the material layer 205. To this end, the etch process 260B may be established on the basis of a reactive process ambient comprising, for instance, a carbon and fluorine-containing gas in combination with at least one polymerizing gas component, such as $CH_2F_2$ or any other polymerizing gases, such as $C_xF_y$, such as $C_4F_6$, $C_4F_8$ and the like. With respect to other process parameters, such as temperature, pressure and the like, the same criteria may apply as previously discussed above with reference to the process 260A. For example, the ambient 260B may be established in the same process chamber as may be used in the previous etch process 260A (FIG. 2a), while, in other cases, a different process chamber may be used, for instance in a cluster tool, thereby avoiding excessive transportation activities. As discussed above, in the process 260B, the flow rate of the polymerizing gas component may be used as an efficient process parameter for re-adjusting the width 206W in accordance with process requirements. For example, during the previous etch step 260A, the width 206W may be substantially determined on the basis of the lateral size of the mask openings 207A, for instance by using substantially constant process parameters, wherein, during the process 260B, the polymerizing gas component may be adjusted so as to obtain a desired value for the width 206W. In this case, as discussed above, any measurement data indicating the lateral size of the openings 207A may be used in order to determine an appropriate target value for the polymerizing gas flow rate during the process 260B in order to appropriately re-adjust the width 206W for the further processing of the device 200. That is, upon increasing the gas flow rate of the polymerizing gas, the width 206W may be reduced during the further advance of the etch process 260B since a substantially inert polymer-containing material may be formed on sidewalls of the openings 207A, 206A. On the other hand, upon reducing the gas flow rate of the polymerizing gas, the lateral etch rate may be increased, thereby increasing the width 206W, if considered appropriate in view of the initial size of the mask openings 207A.

Consequently, at least during one of the processes 260A (FIG. 2a) and 260B (FIG. 2b), an efficient adjustment of the width 206W may be implemented, thereby enabling the further processing of the device 200 on the basis of a re-adjusted lateral size, i.e., the width 206W, even if the openings 207A of different substrates may have a moderately wide spread, which would conventionally result in a significant spread of the corresponding critical dimensions of via openings to be formed in the dielectric layer 241. Furthermore, since the desired critical dimension may be efficiently adjusted on the basis of the width 206W, even a significantly increased valid range for the openings 207A may be defined in advance, thereby reducing the number of substrates that have to be reworked after the formation of the resist mask 207. Thereafter the further processing may be continued by patterning the material layer 205, for instance on the basis of an etch chemistry, as is also previously described with reference to the semiconductor device 100, wherein the openings 206A having the re-adjusted width 206W may act as efficient mask openings. Finally, the hard mask material 204 may be patterned, wherein, as discussed above, substantially the width 206W may be implemented in the corresponding openings, thereby providing superior process control.

Figure 2C:
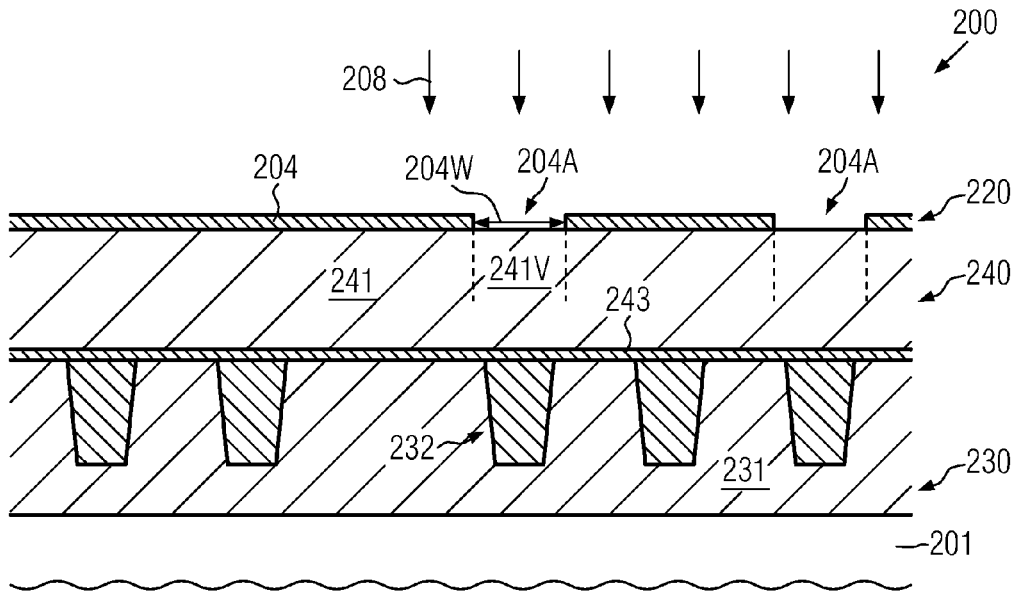
FIG. 2c schematically illustrates a cross-sectional view of the semiconductor device in a further advanced manufacturing stage in which a main etch step may be performed on the basis of hard mask openings, the lateral size of which may be established during the two-step etch process described above, according to still further illustrative embodiments.

FIG. 2c schematically illustrates the semiconductor device 200 in a further advanced manufacturing stage. As shown, the hard mask 204 may comprise mask openings 204A having a lateral size, indicated by 204W, which may correspond to the lateral size 206W as adjusted during the process 260A (FIG. 2a) or the process 260B (FIG. 2b). Based on the hard mask 204, a further etch process 208 may be performed so as to etch into and possibly through the layer 241 in order to form via openings 241V therein. The etch process 208 may be performed on the basis of etch recipes and control mechanisms as are also previously discussed with reference to the device 100. Consequently, the via openings 241V may be formed with lateral dimensions based on the size 204W, which may be centered more closely around the desired target value for the lateral size of the via opening 241V. Thereafter, the processing may be continued by any appropriate process strategy, for instance by forming the vias 241V so as to extend to the etch stop layer 243, while in other cases any trenches may be formed in an upper portion of the dielectric material 241, possibly in combination with a lower portion of the vias 241V, depending on the overall process strategies. After patterning the dielectric material 241 and etching through the etch stop layer 243, any appropriate material, such as copper in combination with barrier materials, may be deposited and any excess material thereof may be removed, for instance by CMP, thereby providing electrically insulated metal lines and vias, as is, for instance, also discussed above with reference to the semiconductor device 100 when referring to FIG. 1a.

Figure 2D:
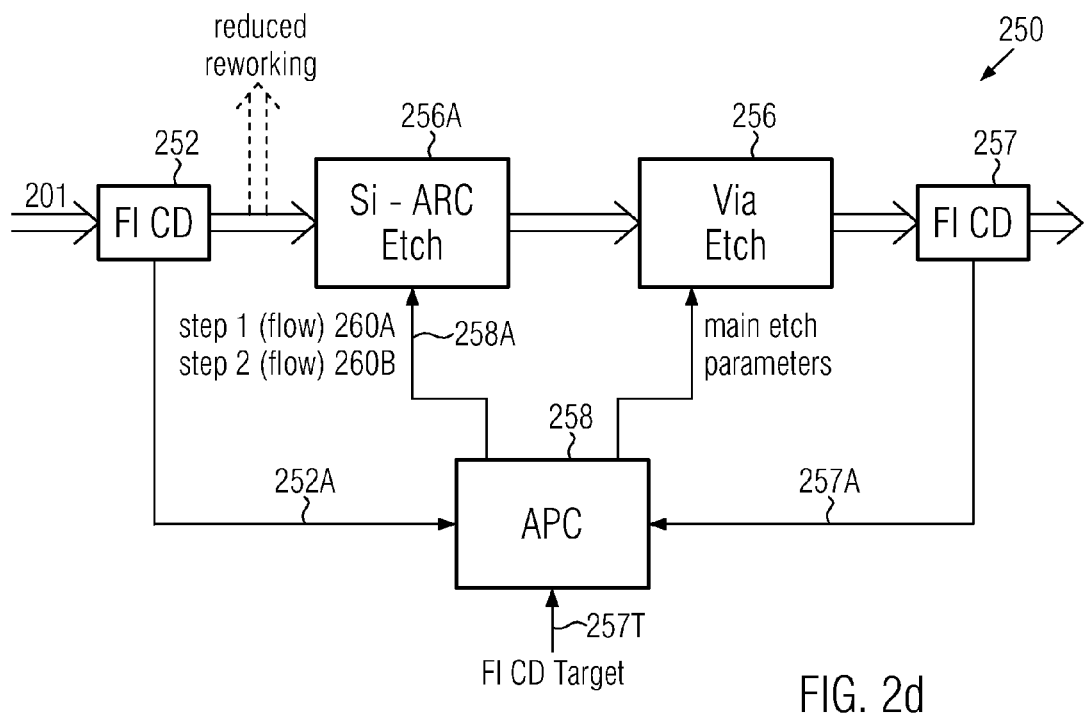
FIG. 2d schematically illustrates a manufacturing environment for patterning a via opening on the basis of a two-step etch process for adjusting mask openings in a silicon-containing ARC layer on the basis of APC strategies, according to still further illustrative embodiments.

FIG. 2d schematically illustrates a portion of a manufacturing environment 250 in which the above-described process sequence for adjusting the critical dimensions of vias may be performed. As illustrated, the environment 250 may comprise a metrology module 252, which may receive the substrate 201 after forming the resist mask 207 (FIG. 2a). Consequently, the module 252 may provide measurement data 252A which may indicate the critical dimension of the resist mask. Based on measurement data 252A, it may also be decided whether or not specific substrates 201 have to be reworked, wherein, as discussed above, a corresponding acceptable range of critical dimensions may be selected to be greater compared to conventional strategies since the corresponding critical dimensions of the resist mask may be re-adjusted, for instance, by approximately 30 percent or more during the two-step etch process for patterning the silicon-containing ARC layer. As shown, a first etch module 256A may be provided, which may be appropriately configured to perform the etch processes 260A, 260B, as described with reference to FIGS. 2a and 2b. To this end, the module 256A may comprise any appropriate etch tools which may be operatively connected to a control unit 258, which may receive the measurement data 252A and which may determine appropriate target values 258A for re-adjusting at least one process parameter of the etch steps 260A, 260B in order to obtain a desired final process result. For example, as discussed above, the control unit 258 may provide a specific target value for an oxygen flow rate for the first etch step 260A, which may result in an increase or decrease of the lateral width of the corresponding first portion of the opening to be formed in the silicon-containing ARC layer. Similarly, the controller 258 may establish an appropriate target value for the flow rate of a polymerizing gas in the second step 260B, so as to obtain the desired target width. To this end, the control unit 258 may comprise any appropriate model of the etch processes 260A, 260B, for instance based on a simple linear correlation between the flow rates and the resulting lateral dimensions and the like. Moreover, the control unit 258 may receive a desired target value 257T of the final critical dimension of the via openings, which may also be correlated with the measurement data 252A in order to provide the target values 258A such that a minimum deviation is expected to be achieved upon performing the actual via etch process in a module 256. The corresponding final critical dimensions provided by the etch module 256 may be determined on the basis of a further metrology module 257, which may thus provide respective measurement data 257A to the control unit 258. Consequently, based on measurement data 257A, the controller 258 may establish a feedback control for the etch module 256, as is also previously discussed with reference to the conventional process strategies, while at the same time additional feedback control may be obtained for the module 256A, which may also be controlled on the basis of a forward control loop by means of the measurement data 252A and the flow rate target values 258A.

As a result, the present disclosure provides manufacturing techniques in which the critical dimensions of vias to be formed in a low-k dielectric material of complex semiconductor devices may be adjusted on the basis of an additional control mechanism by re-adjusting the lateral width of openings formed in a silicon-containing ARC layer by controlling the flow rates in at least one of a two-step etch process. In this manner, an increased variability of critical dimensions of resist masks may be accepted and may be used as input parameter for controlling the flow rates while, at the same time, reducing the spread of the actual critical dimensions of the via openings. In this manner, a wider process window may be defined for the lithography process, thereby reducing maintenance efforts and in particular the reworking of substrates.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a resist mask above a silicon-containing anti-reflective coating (ARC) layer formed above a metallization layer of a semiconductor device, said resist mask comprising a first mask opening having a first lateral size;
    performing a first etch process using a first reactive process ambient so as to etch a first portion of said silicon-containing ARC layer through said first mask opening;
    performing a second etch process using a second reactive process ambient so as to etch through said silicon-containing ARC layer through said first mask opening and to form a second mask opening in said silicon-containing ARC layer, said second mask opening having a second lateral size;
    controlling at least one of said first and second etch processes so as to adjust said second lateral size; and
    forming a via opening in a dielectric material layer of said metallization layer by using said second mask opening.

2. The method of claim 1, wherein forming said via opening comprises forming a third mask opening in a hard mask layer by using said second mask opening and etching said dielectric material layer by using said hard mask layer as an etch mask.

3. The method of claim 1, wherein controlling at least one of said first and second etch processes comprises using measurement data indicating said first lateral size and using a target value of at least one of said first lateral size and a lateral size of said via opening.

4. The method of claim 1, wherein controlling at least one of said first and second etch processes comprises controlling a flow rate of a reactive gas component of said first etch process.

5. The method of claim 4, wherein said reactive component comprises an oxygen gas.

6. The method of claim 1, wherein controlling at least one of said first and second etch processes comprises controlling a flow rate of a polymerizing gas component of said second etch process.

7. The method of claim 6, wherein said polymerizing gas component comprises fluorine and carbon.

8. The method of claim 1, wherein said first etch process is performed by using a carbon and fluorine-containing gas and an oxygen-containing gas.

9. The method of claim 8, wherein said second etch process is performed by using a carbon, hydrogen and fluorine-containing gas.

10. The method of claim 1, wherein said dielectric layer comprises a dielectric material having a dielectric constant of 2.7 or less.

11. The method of claim 1, wherein said first lateral size is approximately 100 nm or less.

12. A method of forming a via opening in a low-k dielectric material of a metallization layer of a semiconductor device, the method comprising:
    receiving measurement data indicating a lateral size of a mask opening formed in a resist layer;
    determining a flow rate of a first gas component for a first etch process by using said measurement data and a target value of said via opening, said first etch process being configured to etch a first portion of an opening into an anti-reflective coating (ARC) layer formed below said resist layer;
    determining a flow rate of a second gas component for a second etch process by using said measurement data and a target value of said via opening, said second etch process being configured to etch said opening through said ARC layer through said first portion;
    performing said first and second etch processes by using said flow rates of said first and second gas components to form said opening; and
    forming said via opening in said low-k dielectric material by using said opening.

13. The method of claim 12, wherein forming said via opening comprises forming a second mask opening in a hard mask layer formed below said ARC layer and etching said low-k dielectric material by using said hard mask layer as an etch mask.

14. The method of claim 13, further comprising using said opening formed in said ARC layer as a mask for etching through an optical planarization material formed below said ARC layer and above said hard mask layer.

15. The method of claim 12, wherein said ARC layer is a silicon-containing ARC layer.

16. The method of claim 15, wherein said first gas component comprises oxygen.

17. The method of claim 16, wherein said second gas component comprises a polymerizing gas.

18. A method, comprising:
    performing a first etch process by using an oxygen-containing precursor gas and a carbon and fluorine-containing precursor gas so as to form a first portion of an opening in a silicon-containing anti-reflective coating (ARC) layer, said silicon-containing ARC layer being formed above a dielectric material of a semiconductor device;
    performing a second etch process by using a polymerizing precursor gas so as to form an opening in said silicon-containing ARC layer through said first portion;
    controlling a flow rate of at least one of said oxygen-containing precursor gas of said first etch process and said polymerizing gas of said second etch process so as to adjust a lateral dimension of said opening;
    forming a mask opening in a hard mask layer on the basis of said opening; and
    etching said dielectric material by using said hard mask layer so as to form a contact opening in said dielectric material.

19. The method of claim 18, wherein controlling a flow rate of at least one of said oxygen-containing precursor gas of said first etch process and said polymerizing gas of said second etch process comprises receiving a measurement data indicating a lateral size of a resist mask opening and determining a target value of at least one of said flow rates on the basis of said measurement data and a target critical dimension of said contact opening.

20. The method of claim 18, wherein said dielectric material is a low-k dielectric material of a metallization layer.

* * * * *